(12) United States Patent
Hoang et al.

(10) Patent No.: US 12,095,185 B2
(45) Date of Patent: Sep. 17, 2024

(54) BUILT-IN CONNECTOR FOR BOARD-TO-BOARD AND FLEX-TO-RIGID BOARD CONNECTION

(71) Applicant: Apple Inc., Cupertino, CA (US)

(72) Inventors: Lan H. Hoang, Los Gatos, CA (US); Takayoshi Katahira, San Jose, CA (US); Bilal Mohamed Ibrahim Kani, Singapore (SG); Kishore N. Renjan, Singapore (SG); Manoj Vadeentavida, Singapore (SG); Jing Tao, Singapore (SG)

(73) Assignee: Apple Inc., Cupertino, CA (US)

( * ) Notice: Subject to any disclaimer, the term of this patent is extended or adjusted under 35 U.S.C. 154(b) by 356 days.

(21) Appl. No.: 17/478,221

(22) Filed: Sep. 17, 2021

(65) Prior Publication Data

US 2023/0089258 A1    Mar. 23, 2023

(51) Int. Cl.
| | |
|---|---|
| H01R 12/71 | (2011.01) |
| H01R 12/52 | (2011.01) |
| H01R 12/57 | (2011.01) |
| H01R 12/58 | (2011.01) |
| H01R 12/62 | (2011.01) |
| H01R 12/79 | (2011.01) |
| H01R 13/62 | (2006.01) |
| H01R 13/631 | (2006.01) |

(52) U.S. Cl.
CPC .......... *H01R 12/718* (2013.01); *H01R 12/52* (2013.01); *H01R 12/57* (2013.01); *H01R 12/58* (2013.01); *H01R 12/62* (2013.01); *H01R 12/79* (2013.01); *H01R 13/6205* (2013.01); *H01R 13/631* (2013.01)

(58) Field of Classification Search
CPC ...... H01R 12/718; H01R 12/52; H01R 12/57; H01R 12/58; H01R 13/6205; H01R 13/631
USPC ........................................... 361/787
See application file for complete search history.

(56) References Cited

U.S. PATENT DOCUMENTS

| | | | |
|---|---|---|---|
| 4,884,335 A | 12/1989 | McCoy et al. | |
| 6,012,931 A | 1/2000 | Michaux et al. | |
| 6,457,876 B1 * | 10/2002 | Sawai ................. | G02B 6/3825 385/92 |
| 7,578,707 B2 | 8/2009 | Stokoe et al. | |
| 8,498,124 B1 * | 7/2013 | Folker .................... | H01F 27/06 361/740 |
| 10,602,612 B1 | 3/2020 | Hoang et al. | |
| 2009/0273359 A1 * | 11/2009 | Stutzman ........... | H01R 13/2407 439/527 |

(Continued)

FOREIGN PATENT DOCUMENTS

| | | | |
|---|---|---|---|
| CA | 2175164 A1 * | 12/1966 | |
| CA | 2175164 A  * | 12/1996 | |
| CN | 110213888 A * | 9/2019 | ........... H01R 12/585 |

*Primary Examiner* — Andargie M Aychillhum
(74) *Attorney, Agent, or Firm* — Aikin & Gallant, LLP (57) ABSTRACT

Stacked circuit board structures and methods of assembly are described. In an embodiment, a stacked circuit board structure includes first circuit board and a second circuit board including a plurality of pins mounted thereon, and the plurality of pins are secured in a plurality of receptacles that are coupled with the first circuit board to provide electrical connection between the first circuit board and the second circuit board.

20 Claims, 11 Drawing Sheets

(56) References Cited

U.S. PATENT DOCUMENTS

2014/0168908 A1\* 6/2014 Chuang ............... H04M 1/00
361/735

\* cited by examiner

BUILT-IN CONNECTOR FOR BOARD-TO-BOARD AND FLEX-TO-RIGID BOARD CONNECTION

BACKGROUND

Field

Embodiments described herein relate to electronic packaging, and more particularly to printed circuit board assembly.

Background Information

Printed circuit boards (PCBs) may commonly be connected using PCB connectors. In a basic multi-pin connection system, a pair of boards including a corresponding mating pair of PCB connectors are fit together, with one PCB connector including an array of header pins, and the mated PCB connector including a corresponding housed array of sockets to receive the array of header pins. Each corresponding PCB connector can be hard soldered to a corresponding board. The housing can function to align and position the header pins accurately, as well as to insulate the header pins and socket contacts from each other.

SUMMARY

Stacked circuit board structures and methods of assembly are described. In some embodiments, the stacked circuit board structures may allow for local strain relief. Furthermore, some embodiments may facilitate the ability for re-work, and overall volume reduction relative to traditional stacked circuit board structures including housed PCB connectors.

In an embodiment, a stacked circuit board structure includes a first circuit board having a first side and a second side opposite the first side, and a second circuit board having a first side and a second side opposite the first side, wherein the first side of the second circuit board faces the second side of the first circuit board. A plurality of pins may be mounted onto the first side of the second circuit board. When brought together the plurality of pins is secured in a plurality of receptacles coupled with the second circuit board. For example, the receptacles may include sockets or board openings, or combinations thereof. The circuit boards may be clamped together with physical or magnetic techniques, or combinations thereof.

DETAILED DESCRIPTION

Embodiments describe stacked circuit board structures in which opposing circuit boards are stacked on top of one another and interconnected with vertical pin arrays. For example, the vertical pin arrays may be for signal and power transmission between the circuit boards.

In an embodiment, a stacked circuit board structure includes a first circuit board having a first side and a second side opposite the first side, and a second circuit board having a first side and a second side opposite the first side, where the first side of the second circuit board faces the second side of the first circuit board. A plurality of pins may be mounted onto the first side of the second circuit board. When brought together the plurality of pins is secured in a plurality of receptacles coupled with the second circuit board. In this manner, a connector is built into the stacked board assembly rather than as a separate component. In accordance with embodiments, the pins and receptacles can be brought together with magnetic or physical force to provide electrical connection between the first circuit board and the second circuit board.

In one aspect, it has been observed that a common reliability failure point for stacked PCB connector assemblies is the solder connection of the PCB connector assemblies to the circuit boards. In accordance with embodiments, the pin connections can be integrated directly onto the circuit boards, and housing-less. This may distribute stresses across the circuit boards, improving reliability. In addition, mechanical contact with the receptacles (e.g. sockets) and pins can allow for local strain relief during drop and temperature cycling. For example, the pins and sockets may be free-standing, and not encased within a housing, between the circuit boards.

In another aspect, embodiments describe stacked circuit board structures in which the in-situ integration of connector assemblies facilitates the ability for re-work, which can allow for repairability and speed matching between electronic components, improving overall production yield and performance.

In yet another aspect, the housing-less aspect of in-situ integration of the connector assemblies onto the circuit boards can result in a volume reduction, reducing overall assembly size and z-height. In some embodiments, the pins and receptacles such as sockets, are free-standing between opposing circuit boards such that they are not encapsulated with a molding compound, or encased within a housing between the opposing circuit boards. This may facilitate the ability to freely re-work the circuit boards or replace one circuit board without replacing both circuit boards.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", and "on" as used herein may refer to a relative position of one layer with respect to other layers. One layer "above", "over", or "on" another layer or bonded "to" or in "contact" with another layer may be directly in contact with the other layer or may have one or more intervening layers. One layer "between" layers may be directly in contact with the layers or may have one or more intervening layers.

Figures 1A, 1B:
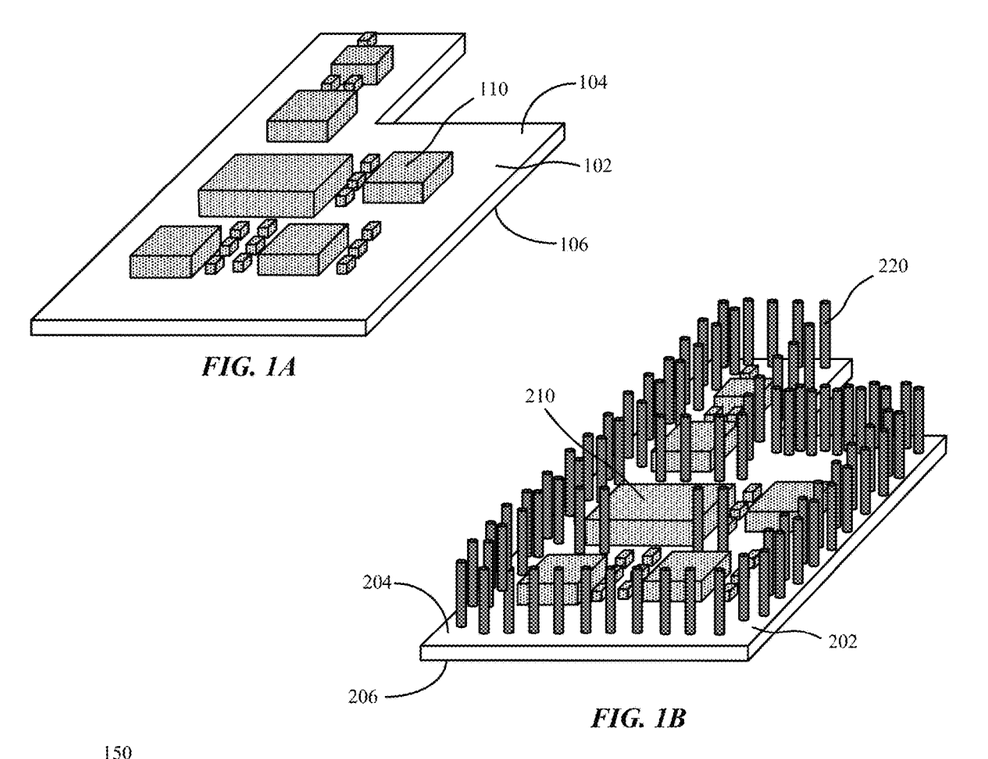
FIG. 1A-1C are perspective view illustrations of a sequence of assembling a stacked circuit board structure with a perpendicular pin array in accordance with an embodiment.
Figure 1C:
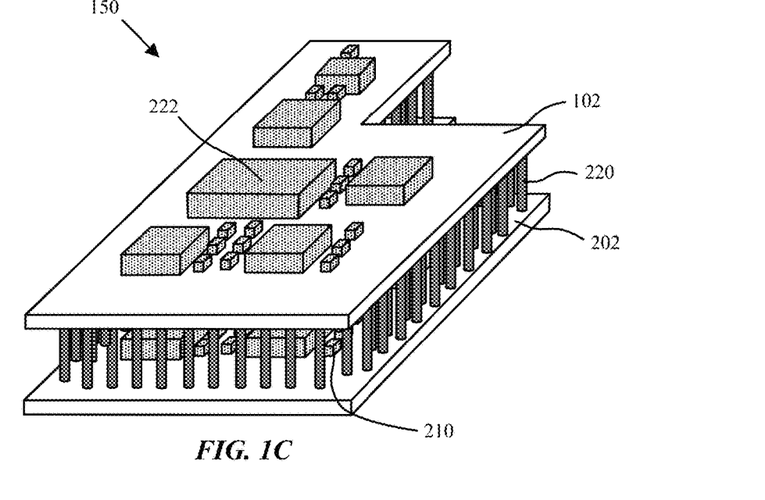

Referring now to FIGS. 1A-1C isometric view illustrations are provided of a sequence of assembling a stacked circuit board structure 150 with a perpendicular pin array in accordance with an embodiment. As illustrated in FIG. 1A, the sequence may begin with a plurality of electronic components 110 mounted on a first circuit board 102. For example, the electronic components 110 can be mounted on a first side 104 of the first circuit board 102 and/or on a second side 106 of the first circuit board 102.

The first circuit board 102 in accordance with embodiments may be rigid or flexible, and may be formed of a variety of suitable printed circuit board (PCB) materials including FR4, prepreg, polyimide, etc. In an embodiment, a flexible first circuit board 102 (also commonly referred to as a flex circuit, or flex board) includes flexible dielectric layers (e.g. polymer such as polyimide, polyester, polyethylene naphthalate, etc.) with laminated circuit patterns (e.g. metal foil pattern such as copper) on one or both sides of the flexible dielectric layers. The electronic components 110 in accordance with embodiments can be dies ranging from system-on-chip (SOC) to memory, passive components (resistors, capacitors, inductors, etc.), micro-electromechanical systems (MEMS), sensors, etc. A variety of configurations of different electronic components is understood.

Referring now to FIG. 1B, a second circuit board 202 is illustrated including a plurality of electronic components 210 mounted on a first side 204 of the second circuit board. Additional electronic components 210 may also be optionally mounted on a second side 206 of the second circuit board 202. Similar to the first circuit board 102, the second circuit board 202 may be rigid or flexible, and formed of the same materials described with regard to the first circuit board 102. Similarly, electronic components 210 may be selected from the same electronic components 210 in accordance with embodiments can be dies ranging from system-on-chip (SOC) to memory, passive components (resistors, capacitors, inductors, etc.), micro-electromechanical systems (MEMS), sensors, etc. In a specific implementation the second circuit board 202 is a rigid wireless access point (AP) board, while the first circuit board 102 is a rigid or flexible radio frequency (RF) board.

Still referring to the embodiment illustrated in FIG. 1B, a plurality of pins 220 is mounted onto the first side 204 of the second circuit board 202 laterally adjacent to the plurality of electronic components 210. As shown, the pins 220 may be taller than the plurality of electronic components 210. The first circuit board 102 may then be mounted onto the pins 220 as illustrated in FIG. 1C. Alternatively, the second circuit board 202 including the pins 220 may be stacked onto the first circuit board 102. In the resulting structure, the first circuit board 102 and the second circuit board 202 are separated by the pins 220 as opposed to an interposer, or housed PCB connector.

Figure 2:
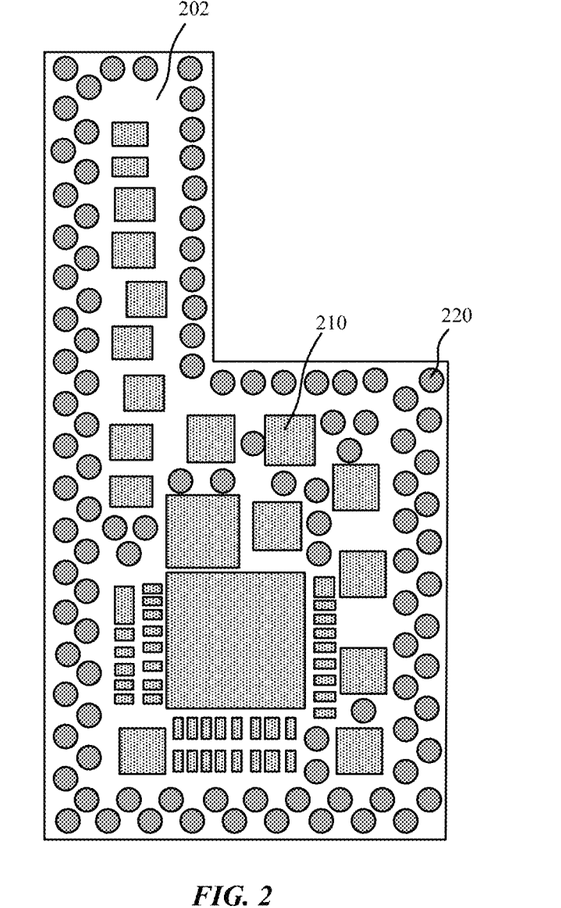
FIG. 2 is a schematic top layout view of circuit board electronic components and a perpendicular pin array on a circuit board in accordance with embodiments.

FIG. 2 is a schematic top layout view of circuit board components and a perpendicular pin array on a circuit board in accordance with embodiments. In interest of clarity, the schematic top layout view of FIG. 2 is made with regard to the electronic components 210 and pins 220 relative to the second circuit board 202 within the circuit board stack. As illustrated, the pins 220 can be placed at any open place, including between electronic components, along the perimeter of the second circuit board 202, or around the perimeter of one or more electronic components 210.

In accordance with embodiments, the first circuit board 102 is configured with a plurality of receptacles to mate with and receive the plurality of pins 220. For example, the receptacles can include sockets of various shapes or board openings within the first circuit board 102. Furthermore, the receptacles can include sockets mounted within board openings in the first circuit board 102. Mechanical contact between the receptacles and pins 220 can help secure the first circuit board 102 to the second circuit board 202, while allowing for strain relief during drop and temperature cycling. Furthermore, integration directly onto or within the circuit boards can reduce overall dimensions, including area and z-height while additionally providing flexibility for electrical vertical interconnects with different dimensions. In some embodiments, magnets can be utilized to attract the circuit boards together and maintain electrical contact between the circuit boards. Furthermore, alignment pins can be included to facilitate contact and gross alignment.

Figure 3A:
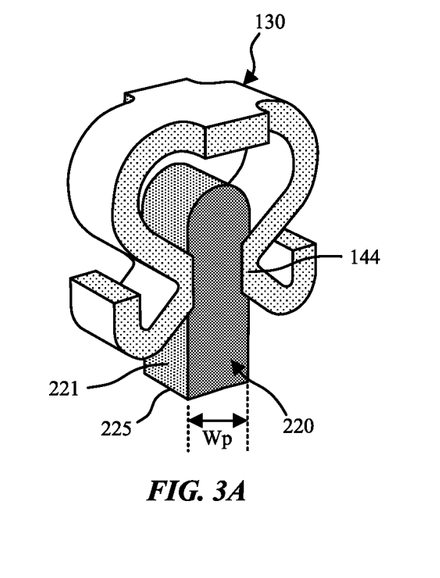
FIG. 3A is a perspective view illustration of a pin and socket receptacle in accordance with an embodiment.

FIG. 3A is a perspective view illustration of a pin 220 and socket 130 receptacle in accordance with an embodiment. As shown, the socket 130 receptacle may be in the shape of a clip in which mechanical punches 44 are designed to provide a compressive clamping force onto sidewalls 221 of pin 220. In an embodiment, the pin 220 is pillar shaped, and extends from a base 225 which can be bonded to the first circuit board 102. For example, the pin 220 can be tubular, rod-like, include multiple sides as shown, obelisk, etc. In accordance with embodiments, the pins 220 can be characterized by a maximum width (Wp). Furthermore, the stacked circuit board structures may include groups of pins having different maximum widths.

Figure 3B:
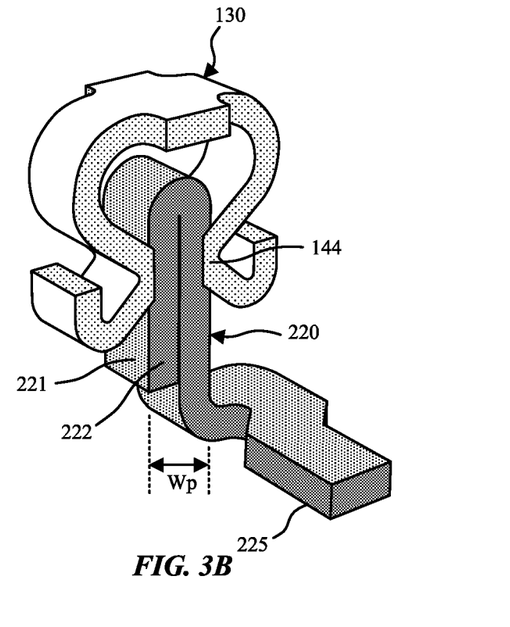
FIG. 3B is a perspective view illustration of a compliant pin and socket receptacle in accordance with an embodiment.

FIG. 3B is a perspective view illustration of a compliant pin 220 and socket 130 receptacle in accordance with an embodiment. In such a configuration, the compliant pin 220 may include a wire 222 shape extending from the base 225 to provide possible x-y bending motion. In the particular embodiment illustrated, the wire 222 can be folded to increase the pin thickness within the socket 130 receptacle.

Figures 4, 5A:
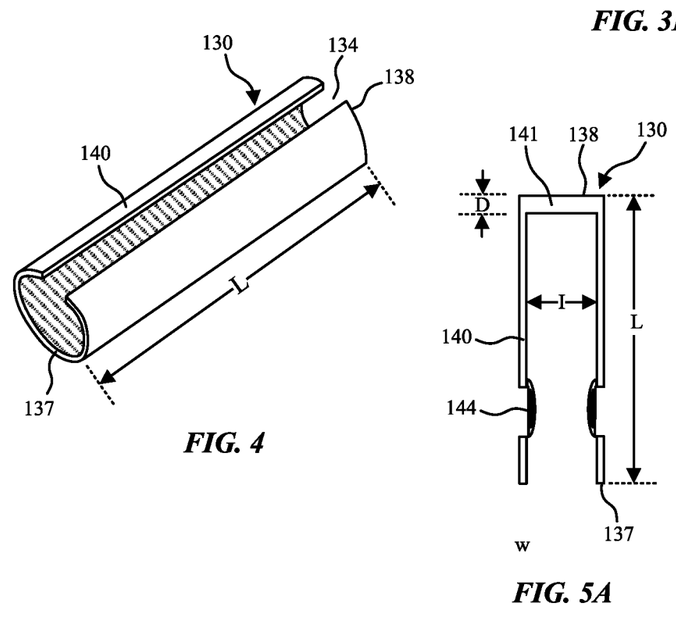
FIG. 4 is a perspective view illustration of a metallic split sleeve socket receptacle in accordance with an embodiment.
FIGS. 5A-5B are schematic cross-sectional side view illustration of mechanical locking pin socket receptacles with different dimensions in accordance with embodiments.

FIG. 4 is a perspective view illustration of a metallic split sleeve socket 130 receptacle in accordance with an embodiment. As shown, the split sleeve socket 130 receptacle can include a tubular sleeve structure with slit 134 through the sidewalls 140 of the tubular sleeve structure running at least a portion of the longitudinal length (L) of the socket 130 receptacle. In an embodiment, the slit 134 is formed at least in the terminal end 137 that accepts the pin 220, and may optionally extend to the base end 138 that can be bonded to the first circuit board 102. In accordance with embodiments, the longitudinal length (L) of the split sleeve socket 130 receptacle can be designed to eliminate wasted space (height) after receiving a pin 220 to reduce total height of the stacked circuit board structure.

Figure 5B:
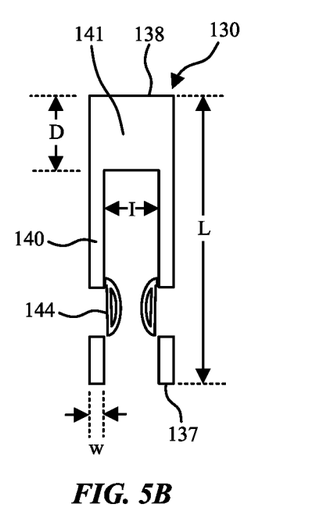

FIGS. 5A-5B are schematic cross-sectional side view illustration of mechanical locking pin socket 130 receptacles with different dimensions in accordance with embodiments. As shown, the locking pin socket 130 receptacles can have a tubular sidewalls 140 of maximum width (w) and a pedestal 141 extending from the base end 138 a depth (D). The tubular sidewalls 140 may have an inner width (I). Mechanical punches 144 can protrude from the sidewalls 140 to press onto the pins 220 when inserted. For example, mechanical punches 144 can be dome-shaped mesa structures extending from the sidewalls 140, or compliant members that can be pushed into the sidewalls 140 by insertion of the pin 220 while still providing a locking function to retain the pin 220. Multiple mechanical punches 144 can be distributed around a perimeter of the sidewalls 140, or a continuous mechanical punch 144 can be formed along the sidewalls 140. As shown in FIGS. 5A-5B, dimensions of the locking pin socket 130 receptacles can be varied. For example, maximum width (w) of the sidewalls 140 can be adjusted to provide a specific conductivity or pressure. Likewise depth (D) of the pedestal 141 and longitudinal length (L) can be adjusted. In some embodiments, locking pin socket 130 receptacles with different dimensions are provided to accommodate pins 220 of different sizes (e.g. maximum widths). For example, different pin sizes can be used to transfer power or ground signals compared to RF signals. Alternatively, the same pin sizes can be used, while adjusting dimensions of the locking pin socket 130 receptacles. For example, inner width (I) can be maintained, while maximum width (w) of the sidewalls 140 is adjusted for signals. In an embodiment, a pin 220 carrying an RF signal is retained by a locking pin socket 130 receptacle with thicker maximum width (w) of the sidewalls 140 to mitigate insertion loss, while a pin 220 carrying a power or ground signal can be retained by a locking pin socket 130 receptacle with thinner maximum width (w) of the sidewalls 140.

It is to be appreciated that the particular examples illustrated in FIGS. 3A-5B are illustrative of possible pin and socket 130 receptacle configurations, and embodiments are not necessarily limited to the specific structures illustrated. The clip structures of FIGS. 3A-3B may resemble a more traditional-type socket design, while FIGS. 4-5B represent alternative designs that may potentially reduce space.

Figure 6A:
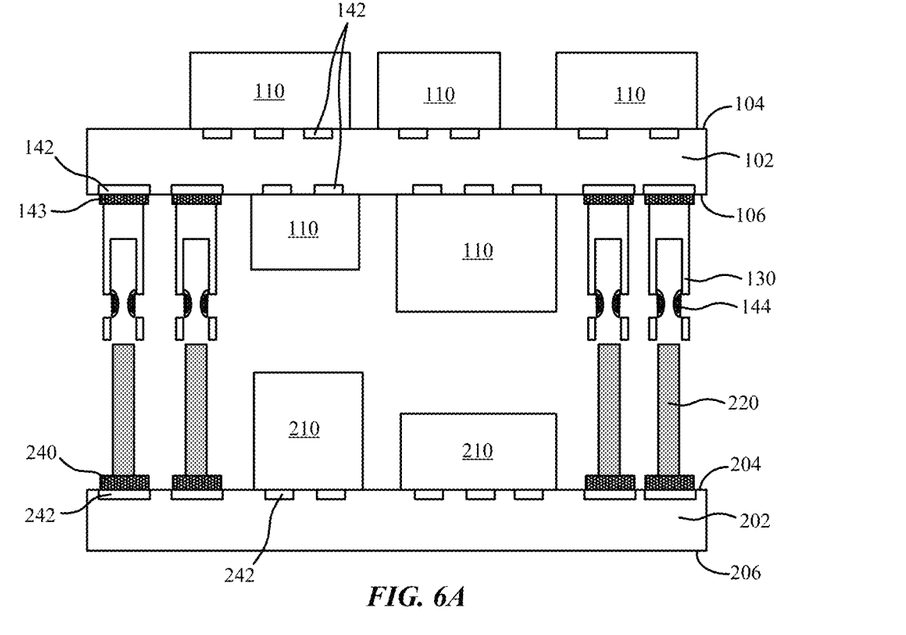
FIGS. 6A-6B are schematic cross-sectional side view illustrations of a sequence of assembling a stacked circuit board structure with a surface mounted perpendicular pin array and surface mounted socket receptacles in accordance with an embodiment.
Figure 6B:
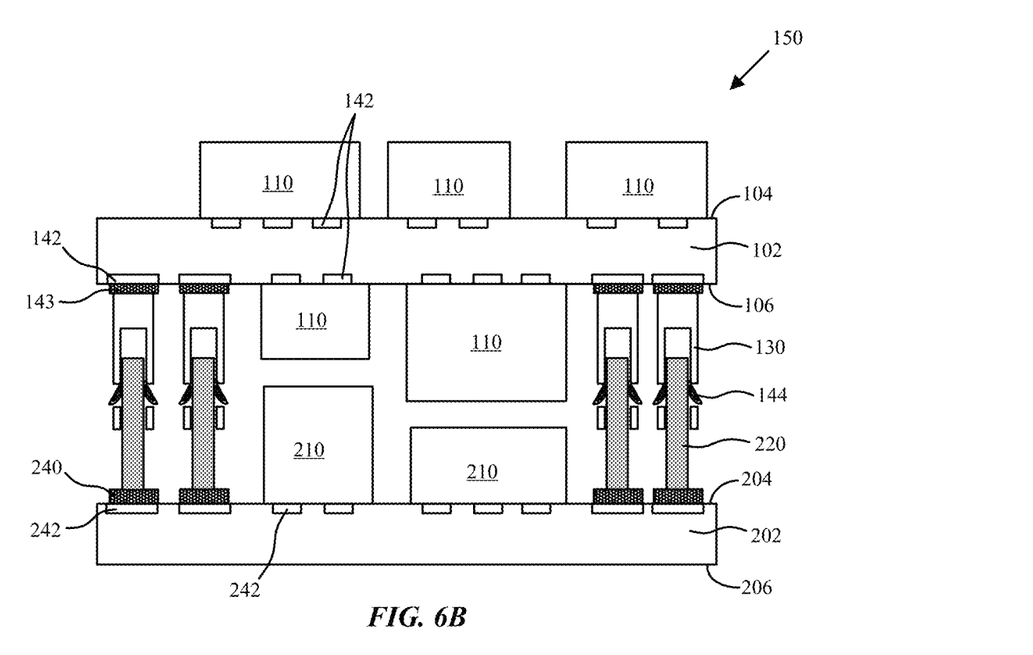

Referring now to FIGS. 6A-6B schematic cross-sectional side view illustrations are provided for a sequence of assembling a stacked circuit board structure 150 with a surface mounted perpendicular pin array and surface mounted socket receptacles in accordance with an embodiment. In particular, FIG. 6A illustrates a first circuit board 102 with a plurality of socket 130 receptacles aligned over a second circuit board 202 with a plurality of pins 220, while FIG. 6B illustrates a stacked circuit board structure 150 with the plurality of pins 220 secured in the plurality of socket 130 receptacles. As illustrated, the stacked circuit board structure 150 may include a first circuit board 102 having a first side 104 and a second side 106 opposite the first side, and a second circuit board 202 having a first side 204 and a second side 206 opposite the first side, where the first side 204 of the second circuit board 202 faces the second side 106 of the first circuit board 102. A plurality of pins 220 may be mounted onto the first side 204 of the second circuit board 202. For example, the pins 220 can be bonded with a solder material 240. When brought together, the plurality pins 220 is secured in the corresponding plurality of socket 130 receptacles that are coupled with the first circuit board 102, which provide an electrical connection between the first circuit board 102 and the second circuit board 202.

In the particular embodiment illustrated the plurality of socket 130 receptacles is mounted onto the second side 106 of the first circuit board 102. For example, each socket 130 receptacle can be separately mounted, for example with a separate solder material 143. Similarly, each pin 220 of the plurality of pins can be separately bonded to the first side 204 of the second circuit board 202 with a separate solder material 240.

In accordance with embodiments, the socket 130 receptacles can be bonded to corresponding landing pads 142 of the first circuit board 102 to provide electrical connection to wiring within the first circuit board 102 as well as electronic components 110 mounted on the first and/or second sides of the first circuit board 102. Likewise, electronic components 110 can also be mounted onto and in electrical connection with corresponding landing pads 142. Similarly, pins 220 and electronic components 210 can be bonded to landing pads 242 of the second circuit board 202 to provide electrical connection to wiring within the second circuit board 202 as wells as between the electronic components 210 and pins 220.

In accordance with embodiments, the pins 220 and sockets 130 are free-standing between the first circuit board 102 and the second circuit board 202 such that they are not encapsulated with a molding compound or encased within a housing between the opposing circuit boards. For example, adjacent pins 220 and sockets 130 may be separated by air. This may facilitate the ability to freely re-work the circuit boards or replace one circuit board without replacing both circuit boards In some embodiments, the plurality of pins 220 includes a first group of pins with a first maximum width (Wp), and a second group of pins with a second maximum width (Wp) that is greater than the first maximum width. In some embodiments, the plurality of socket receptacles includes a first group of sockets with a first maximum wall width (w), and a second group of sockets with a second maximum wall width (w) that is greater than the first maximum wall width.

It is to be appreciated that while the embodiment illustrated in FIGS. 6A-6B is made with regard to the socket receptacles illustrated in FIGS. 5A-5B, this is merely exemplary and a variety of different socket receptacles and pin configurations can be used including, but not limited to, those illustrated and described with regard to FIGS. 3A-3B and FIG. 4.

Figure 7A:
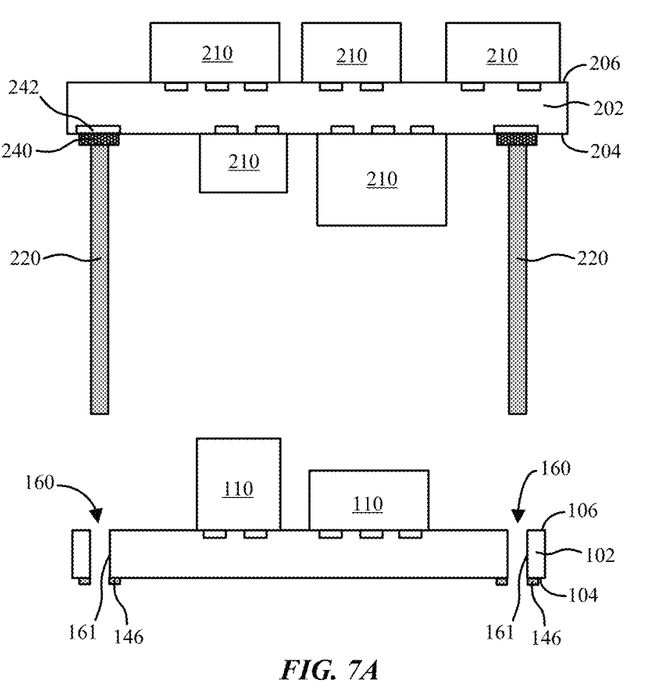
FIGS. 7A-7B are schematic cross-sectional side view illustrations of a sequence of assembling a stacked circuit board structure with a surface mounted perpendicular pin array and board openings in a receiving circuit board in accordance with an embodiment.
Figure 7B:
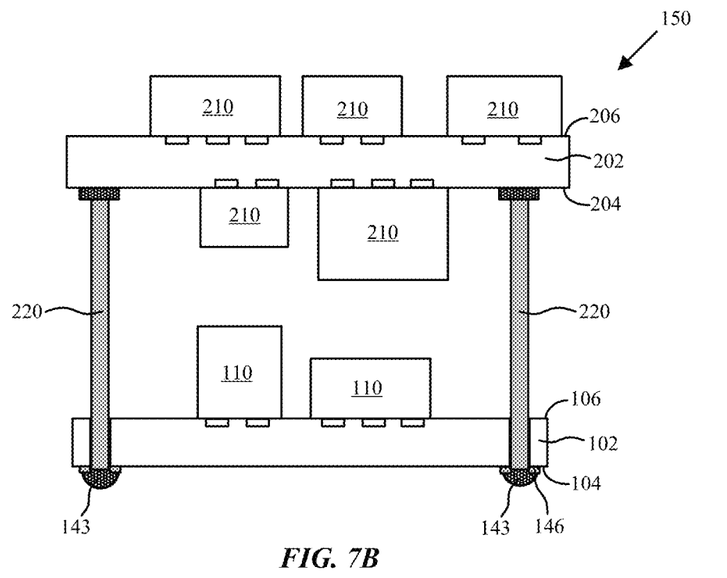

Referring now to FIGS. 7A-7B, schematic cross-sectional side view illustrations are provided for a sequence of assembling a stacked circuit board structure 150 with a surface mounted perpendicular pin array and board openings in a receiving circuit board in accordance with an embodiment. In particular, FIG. 7A illustrates a first circuit board 102 with a plurality of receptacles aligned under a second circuit board 202 with a plurality of pins 220, while FIG. 7B illustrates a stacked circuit board structure 150 with the plurality of pins 220 secured in the plurality of receptacles.

As illustrated, the stacked circuit board structure 150 may include a first circuit board 102 having a first side 104 and a second side 106 opposite the first side, and a second circuit board 202 having a first side 204 and a second side 206 opposite the first side, where the first side 204 of the second circuit board 202 faces the second side 106 of the first circuit board 102. A plurality of pins 220 may be mounted onto the first side 204 of the second circuit board 202. For example, the pins 220 can be bonded with a solder material 240. When brought together, the plurality pins 220 is secured in the corresponding plurality of receptacles that are coupled with the first circuit board 102, which provide an electrical connection between the first circuit board 102 and the second circuit board 202.

Specifically, the plurality of receptacles can include a plurality of separate board openings 160 extending at least partially through the first circuit board 102, where the plurality of pins 220 is secured in the plurality of board openings 160. As shown, solder material 143 may be used to bond the pins 220 to contact pads 146 on the first side 104 of the first circuit board 102. For example, the contact pads 146 can be formed only on the first side 104 of the first circuit board 102 or as barrel contacts that also line sidewalls 161 of board openings 160, and optionally the second side 106 of the first circuit board 102. In an embodiment, a first plurality of electronic components 110 is mounted on the second side 106 of the first circuit board 102, a second plurality electronic components 210 is mounted on the first side 204 of the second circuit board, and the plurality of pins 220 extends laterally adjacent to the first plurality of electronic components 110 and the second plurality of electronic components 210.

Figure 8A:
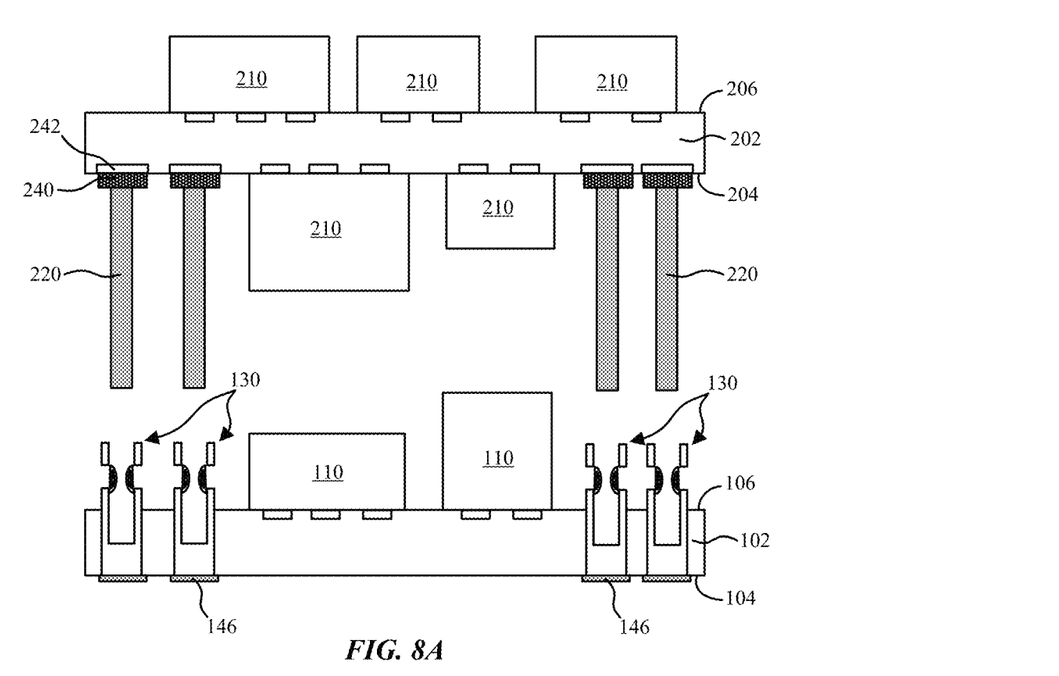
FIGS. 8A-8B are schematic cross-sectional side view illustrations of a sequence of assembling a stacked circuit board structure with a surface mounted perpendicular pin array and socket receptacles mounted in corresponding board openings in a receiving circuit board in accordance with an embodiment.
Figure 8B:
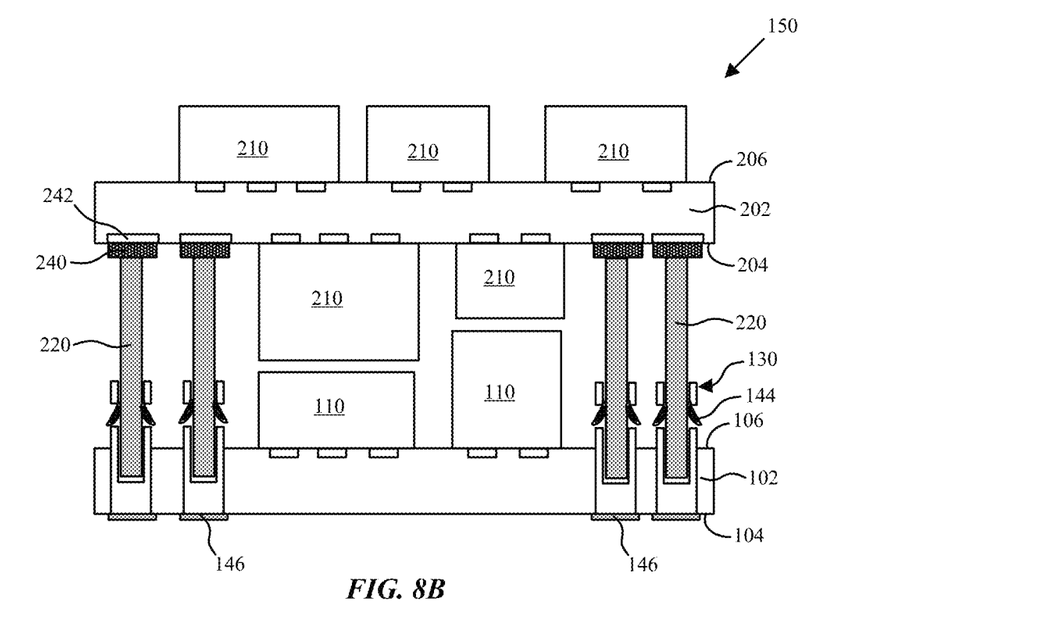

The sockets 130 and board openings 160 in accordance with embodiments are not necessarily mutually exclusive. In some embodiments, the receptacles include both sockets 130 receptacles and board openings 160. FIGS. 8A-8B are schematic cross-sectional side view illustrations of a sequence of assembling a stacked circuit board structure 150 with a surface mounted perpendicular pin array and sockets 130 mounted in corresponding board openings 160 in a receiving circuit board in accordance with an embodiment. In such an embodiment, each receptacle of the plurality of receptacles includes a socket 130 secured in a corresponding board opening 160 in the first circuit board 102, and a corresponding pin 220 is secured in the socket 130. In such a configuration, the pin 220 can also extend into the board opening 160. In such a configuration, orientation of the socket 130 within the first circuit board 102 can potentially lead to a further reduction in z-height for the stacked circuit board structure 150.

Up until this point, stacked circuit board structures have been described as including pin-to-receptacle connections made with physical force. In some embodiments, magnets may be used to retain the stacked circuit board configuration.

Figure 9:
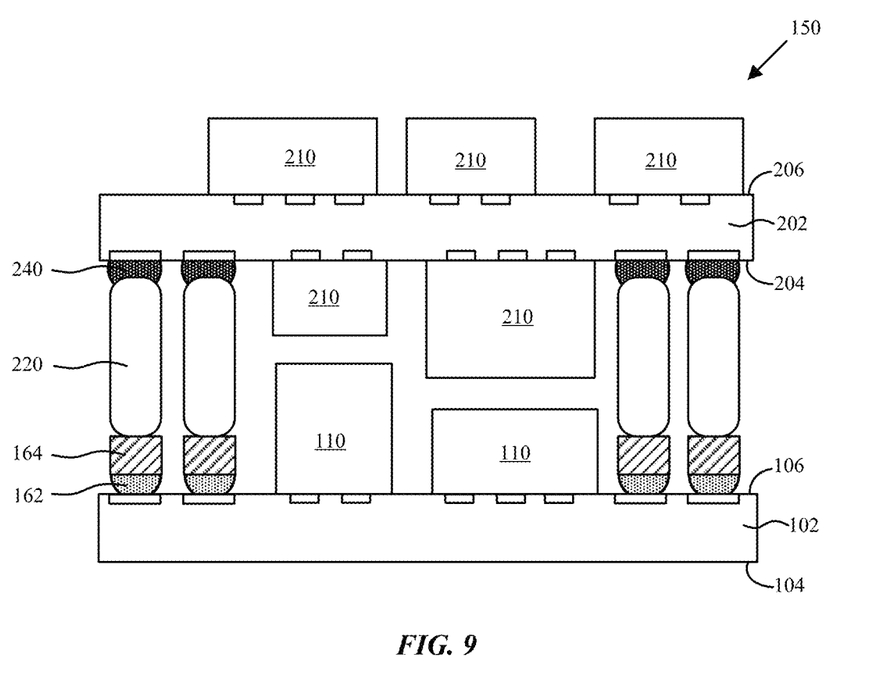
FIG. 9 is a schematic cross-sectional side view illustration of a stacked circuit board structure with a magnetic perpendicular pin array in accordance with an embodiment.

FIG. 9 is a schematic cross-sectional side view illustration of a stacked circuit board structure 150 with a magnetic perpendicular pin array in accordance with an embodiment. In the particular embodiment illustrated, the stacked circuit board structure 150 includes a first circuit board 102 having a first side 104 and a second side 106 opposite the first side, a second circuit board 202 having a first side 204 and a second side 206 opposite the first side, where the first side 204 of the second circuit board 202 faces the second side 106 of the first circuit board 102. As shown a plurality of magnets 164 can be separately mounted onto the second side 106 of the first circuit board 102. For example, this may be accomplished with a conductive epoxy or low temperature solder material 162. A plurality of pins 220 can be mounted onto the first side 204 of the second circuit board 202, for example using a plurality of solder materials 240. The second circuit board 202 and the first circuit board 102 can be brought together, with the plurality of pins 220 rest on the plurality of magnets 164, and each pin 220 is attracted to a magnetic field of a corresponding magnet. For example, the pins 220 may be formed of a material that can be magnetized, such as some stainless steels.

Figure 10:
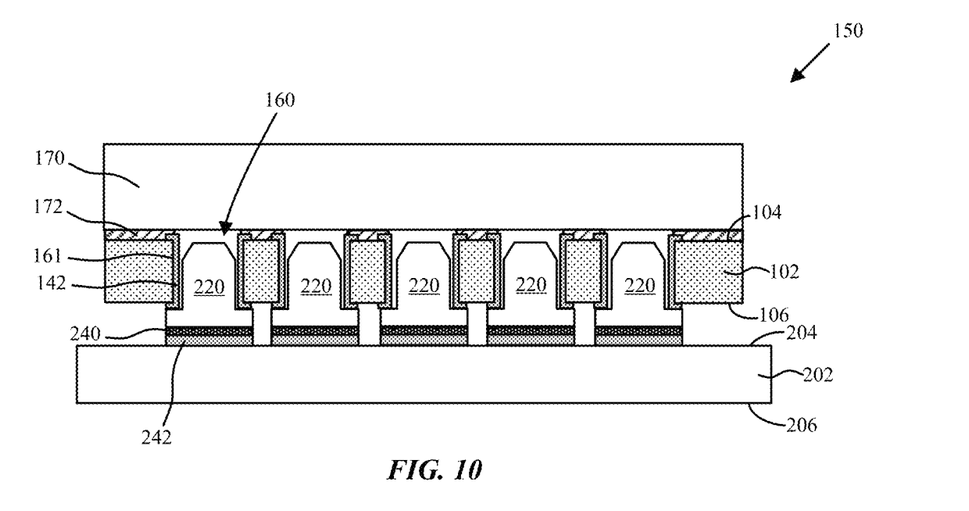
FIG. 10 is a schematic cross-sectional side view illustration of a stacked circuit board structure with a surface mounted perpendicular pin array, board openings in a receiving circuit board, and magnetic stiffener clamp in accordance with an embodiment.
Figure 11:
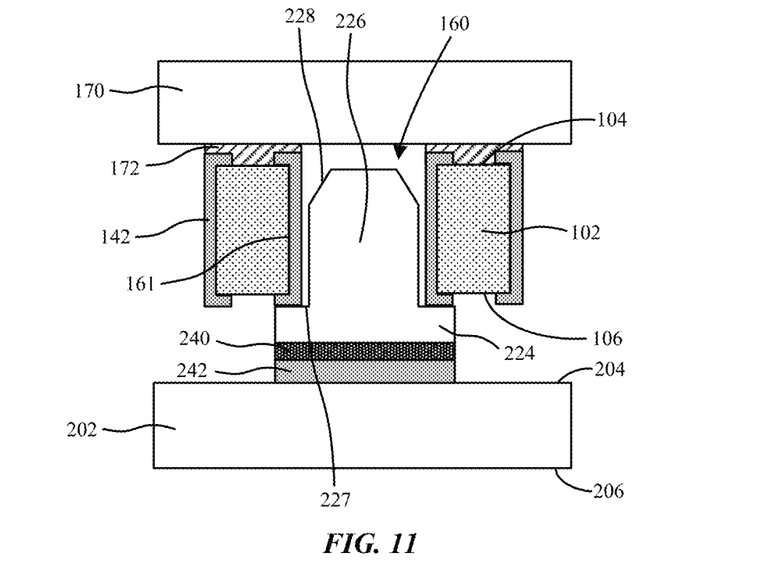
FIG. 11 is a close-up schematic cross-sectional side view illustration of circuit board resting on a base structure of a pin in accordance with an embodiment.

FIG. 10 is a schematic cross-sectional side view illustration of a stacked circuit board structure 150 with a surface mounted perpendicular pin array, board openings 160 in a receiving circuit board, and magnetic stiffener structure 170 in accordance with an embodiment. FIG. 11 is a close-up schematic cross-sectional side view illustration of a pin 220 secured in a board opening 160 in accordance with an embodiment.

As illustrated, the stacked circuit board structure 150 may include a first circuit board 102 having a first side 104 and a second side 106 opposite the first side, and a second circuit board 202 having a first side 204 and a second side 206 opposite the first side, where the first side 204 of the second circuit board 202 faces the second side 106 of the first circuit board 102. A plurality of pins 220 may be mounted onto the first side 204 of the second circuit board 202. For example, the pins 220 can be bonded with a solder material 240. When brought together, the plurality pins 220 is secured in the corresponding plurality of receptacles that are coupled with the first circuit board 102, which provide an electrical connection between the first circuit board 102 and the second circuit board 202. Clamping force may be provided by a magnetic stiffener structure 170 to attract the array of pins 220 and/or second circuit board 202. The magnetic stiffener structure 170 can be secured to the first side 104 of the first circuit board 102 with any suitable adhesive material 172 (e.g. epoxy, solder, etc.).

The plurality of receptacles can include a plurality of separate board openings 160 extending at least partially through the first circuit board 102, where the plurality of pins 220 is secured in the plurality of board openings 160. In the embodiment illustrated, landing pads 142 may be in the form of barrel contacts. For example, the barrel contacts can be through-hole plated (e.g. copper) along sidewalls 161 of the board openings, as well as along the second side 106 and optionally first side 104 of the first circuit board 102. As shown, each pin 220 can include a base structure 224 and mesa structure 226 protruding from the base structure 224. The base structure 224 can be wider than the mesa structure 226 so that the first circuit board 102 rests on a ledge 227 of the base structure 224 for each pin 220 of the plurality of pins. Each mesa structure 226 may also include tapers 228 along a top surface to facilitate guiding of the pins 220 into the board openings 160. Electrical contact may be made by contacting the landing pads 142 with the pins 220, where pressure is applied by attracting the pins 220 and/or second circuit board to the magnetic field supplied by the magnetic stiffener structure 170. For example, pins 220 may be formed of a magnetizable material.

In one aspect, the stacked circuit board structure of FIGS. 10-11 can be used to connect multiple circuit boards with a thin form factor. In a particular embodiment, the second circuit board 202 is a rigid circuit board, while the first circuit board 102 is a flexible circuit board. Pin size can be at least partially determined by first circuit board 102 thickness. Where electronic components are not mounted on the facing circuit board sides, the vertical interconnection thickness can be largely attributed to only solder material 240 thickness, adhesive layer 172 thickness, and base structure 224 thickness. The form factor can be even further reduced by removal of the base structure 224.

Figure 12:
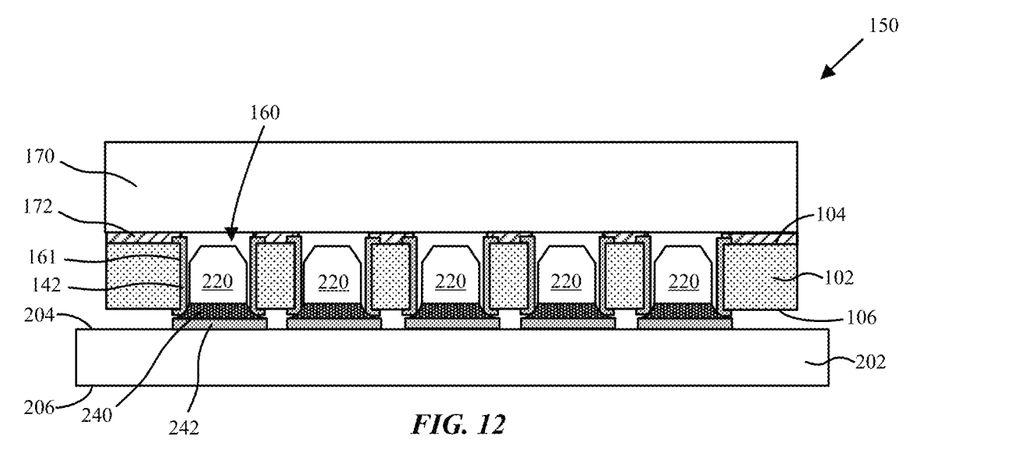
FIG. 12 is a schematic cross-sectional side view illustration of a stacked circuit board structure with a surface mounted perpendicular pin array, board openings in a receiving circuit board, and magnetic stiffener clamp in accordance with an embodiment.
Figure 13:
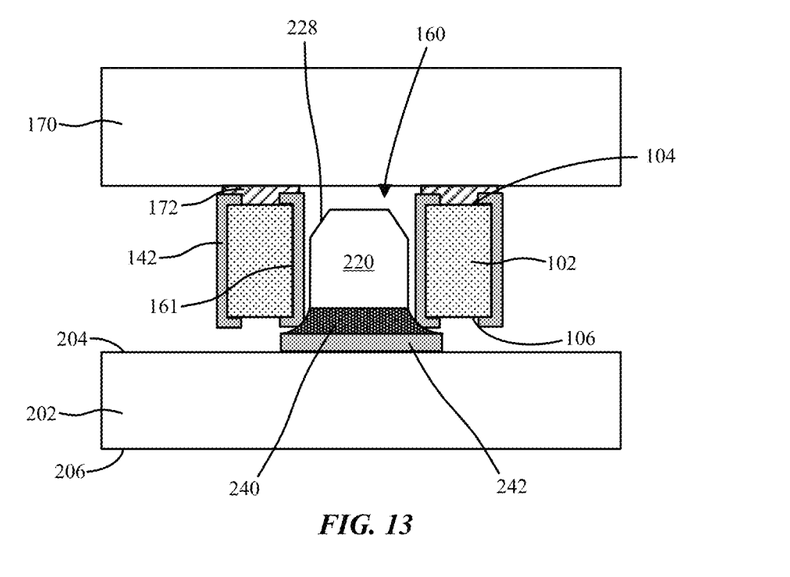
FIG. 13 is a close-up schematic cross-sectional side view illustration of circuit board resting on a bonding layer for a pin in accordance with an embodiment.

FIG. 12 is a schematic cross-sectional side view illustration of a stacked circuit board structure 150 with a surface mounted perpendicular pin array, board openings 160 in a receiving circuit board, and magnetic stiffener structure 170 in accordance with an embodiment. FIG. 13 is a close-up schematic cross-sectional side view illustration of circuit board resting on a solder material 240 for a pin 220 in accordance with an embodiment. FIGS. 12-13 are substantially similar to those of FIGS. 10-11, with the elimination of base structure 224. As such, each pin 220 can be I-shaped, rather than T-shaped. Upon bringing the first circuit board 102 and second circuit board 202 together, the first circuit board 102 may rest on the solder material 240 used to mount the pins 220 onto the landing pads 242. Alternatively, the first circuit board 102 may rest directly on the landing pads 242. In both cases, electrical contact can be made directly with the landing pads 142 of the first circuit board.

The stacked circuit board structures 150 described thus far have utilized clipping force from sockets or magnets to maintain contact between the circuit boards. In accordance with embodiments, these mechanisms can be further supported by alignment pins, to aid with rough alignment as well as to provide clamping force. Alternatively, alignment pins can be utilized to provide clamping force without the presence of sockets or magnets.

Figure 14:
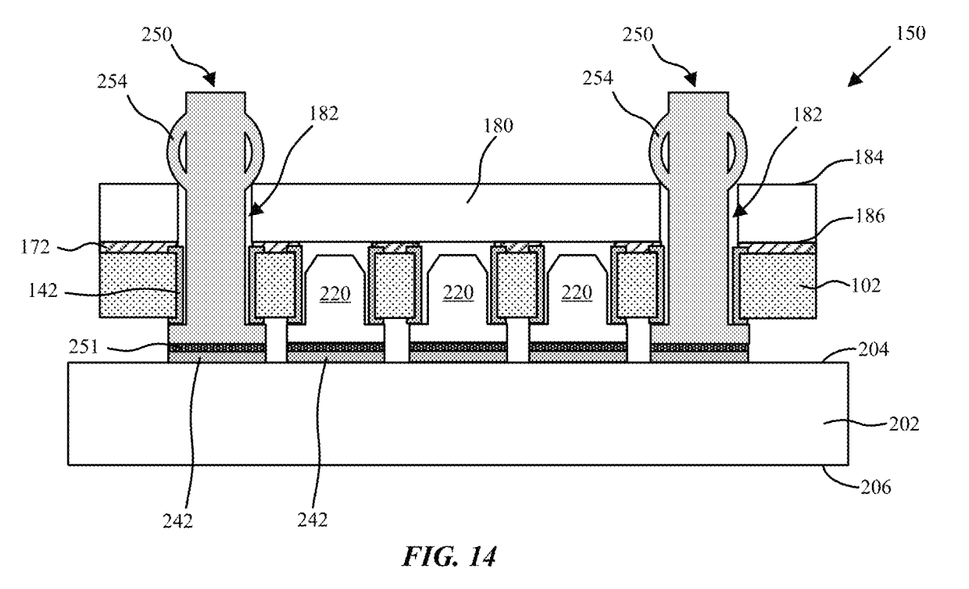
FIG. 14 is a schematic cross-sectional side view illustration of a stacked circuit board structure with a plurality of alignment pins in accordance with an embodiment.
Figure 15:
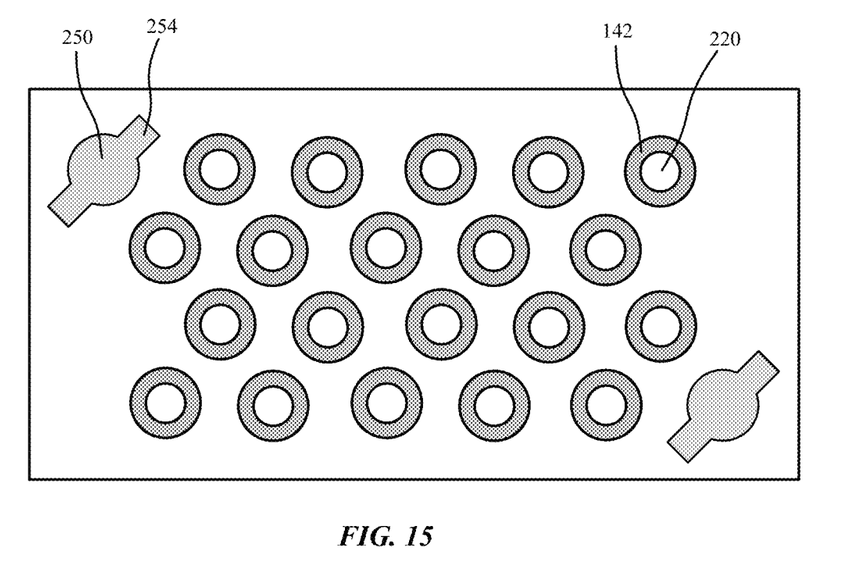
FIG. 15 is a schematic top view illustration of a perpendicular pin array and alignment pins in accordance with an embodiment.

FIG. 14 is a schematic cross-sectional side view illustration of a stacked circuit board structure 150 with a plurality of alignment pins 250 in accordance with an embodiment. FIG. 15 is a schematic top view illustration of a perpendicular pin array and alignment pins 250 in accordance with an embodiment. For illustrative purposes, FIG. 14 is similar to the structure illustrated and described with regard to FIG. 10. It is to be appreciated however that this is exemplary, and the alignment pins 250 are not limited to the particular pin 220 configuration. Several distinctions are present in FIG. 14 relative to FIG. 10. Foremost, the stiffener structure 180 may or may not be magnetic. Secondly, the stiffener structure 180 is optional, and may or may not be used. In some embodiments, the alignment pins 250 provide requisite clamping force. The optional stiffener structure 180 includes a first side 184 and a second side 186 and a plurality of alignment openings 182 extending therebetween. The second side 186 of the stiffener structure 180 may optionally be adhered to the first circuit board using a suitable adhesive layer 172. As shown, a plurality of alignment pins 250 are mounted onto the first side 204 of the second circuit board 202. Suitable bonding material 251 may be used such as epoxy, solder, etc. Each alignment pin 250 may further include a spring portion 254, illustrated as an O-ring spring. Once brought together, the spring portions 254 may be positioned above the first side of the first circuit board 102 and press the first circuit board 102 toward the second circuit board 202. Thus, where the first circuit board 102 is rigid enough, a stiffener structure 180 may be optional. Alternatively, the spring portions 254 can press directly against the first side 184 of the stiffener structure 180 which in turn transfers the pressure.

Figure 16:
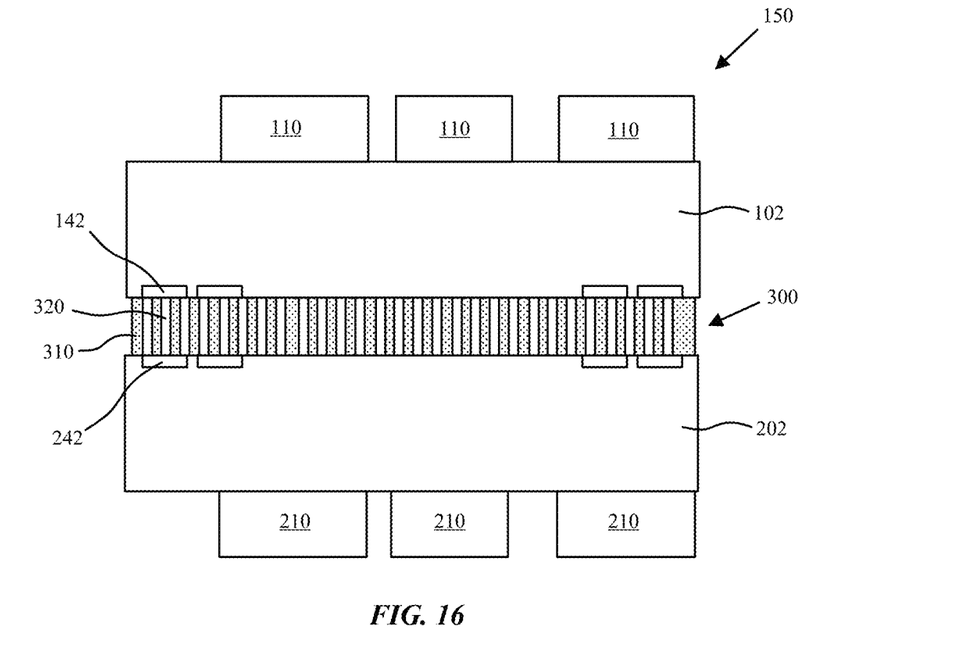
FIGS. 16-17 are schematic cross-sectional side view illustrations of stacked circuit board structures including an intermediate interposer with a plurality of vertical wires in accordance with embodiments.
Figure 17:
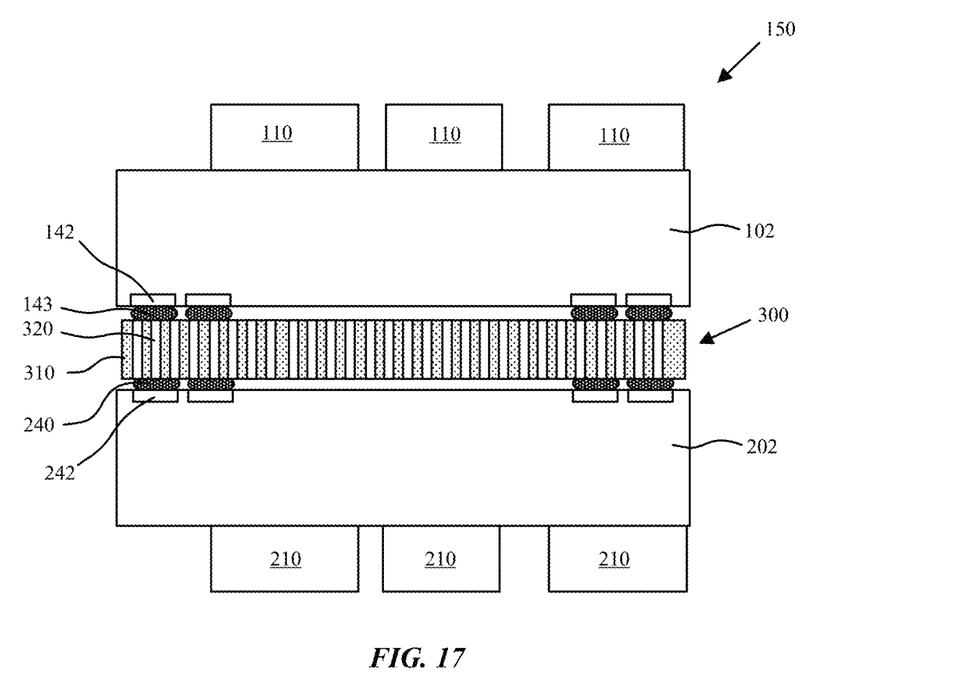

Referring now to FIGS. 16-17 schematic cross-sectional side view illustrations are provided for stacked circuit board structures 150 including an interposer 300 with a plurality of vertical wires 320 in accordance with embodiments. In an embodiment, nano or micro wires can be vertically embedded in a polymer layer 310 or flex board to provide anisotropic conductive properties and fine pitch capability. The vertical wires 320 may have a diameter of 100 nm to 5 μm, and be formed of materials such as Cu, Ni, Ag, Au metals or alloys. In an embodiment, the vertical wires 320 may be electroplated or electroless plated. In an embodiment, the interposer 300 has a maximum thickness of 200 μm.

In the particular embodiment illustrated in FIG. 16, the interposer 300 can be directly applied between landing pads 142, 242 to form contact with the vertical wires by polymer curing. For example, heat can be applied to flow and cure a thermosetting polymer (e.g. epoxy, acryl, etc.) including the vertical wires 320 directly onto the first circuit board 102 and the second circuit board 202. In such a configuration, the cured polymer layer 310 may adhere to the landing pads 142, 242 to provide mechanical support and the vertical wires 320 may contact landing pads 142, 242 to provide electrical connection. Such a technique can additional increase alignment tolerances when arranging the circuit boards. Alternatively, in the embodiment illustrated in FIG. 17, a solder material 143, 240 (or conductive adhesive) can be used to bond to the interposer 300 to the landing pads 142, 242. In either configuration, the polymer layer 310 may absorb mechanical and thermal stress, and provide some compliance for the stacked assembly.

In utilizing the various aspects of the embodiments, it would become apparent to one skilled in the art that combinations or variations of the above embodiments are possible for forming a stacked circuit board structure. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A stacked circuit board structure comprising:
   a first circuit board having a first side and a second side opposite the first side;

a second circuit board having a first side and a second side opposite the first side, wherein the first side of the second circuit board faces the second side of the first circuit board;
a plurality of pins mounted onto the first side of the second circuit board;
wherein the plurality of pins is secured in a plurality of receptacles coupled with the first circuit board to provide electrical connection between the first circuit board and the second circuit board; and
wherein the plurality of receptacles includes plurality of separate board openings extending at least partially through the first circuit board, and the plurality of pins is secured in the plurality of separate board openings.

2. The stacked circuit board structure of claim 1, wherein each pin of the plurality of pins is separately bonded to the first side of the second circuit board.

3. The stacked circuit board structure of claim 2, wherein each pin of the plurality of pins is separately bonded to the first side of the second circuit board with a corresponding solder material.

4. The stacked circuit board structure of claim 1, wherein each receptacle is a socket including mechanical punch.

5. The stacked circuit board structure of claim 1, wherein each receptacle comprises a sleeve including a slit along a longitudinal length of the sleeve.

6. The stacked circuit board structure of claim 1, wherein each pin includes a base structure and a mesa structure protruding from the base structure, wherein the base structure is wider than the mesa structure.

7. The stacked circuit board structure of claim 6, wherein the first circuit board rests on the base structure for each pin of the plurality of pins.

8. The stacked circuit board structure of claim 7, further comprising a magnetic stiffener structure on the second side of the first circuit board, wherein the plurality of pins is attracted to a magnetic field of the magnetic stiffener structure.

9. The stacked circuit board structure of claim 1, wherein each pin is bonded to the second circuit board with a corresponding bonding layer.

10. The stacked circuit board structure of claim 9, wherein the second circuit board is in direct contact with the corresponding bonding layer for each pin.

11. The stacked circuit board structure of claim 1, further comprising a plurality of alignment pins mounted onto the first side of the second circuit board, wherein each alignment pin extends through a corresponding alignment opening in the first circuit board, and each alignment pin includes a spring portion positioned above the first side of the first circuit board.

12. The stacked circuit board structure of claim 11, wherein each spring portion presses the first circuit board toward the second circuit board.

13. The stacked circuit board structure of claim 1, further comprising:
a plurality of contact pads on the first side of the first circuit board, each contact pad corresponding to a board opening through the first circuit board; and
a plurality of separate solder materials bonding the plurality of pins to the plurality of contact pads.

14. The stacked circuit board structure of claim 13, further comprising a first plurality of electronic components mounted on the second side of the first circuit board, and a second plurality of electronic components mounted on the first side of the second circuit board, wherein the plurality of pins extends laterally adjacent to the first plurality of electronic components and the second plurality of electronic components.

15. The stacked circuit board structure of claim 1, wherein the plurality of receptacles includes a plurality of sockets secured in the plurality of separate board openings in the first circuit board, wherein the plurality of pins is secured in the plurality of sockets.

16. The stacked circuit board structure of claim 1, wherein the plurality of pins includes a first group of pins with a first maximum width, and a second group of pins with a second maximum width that is greater than the first maximum width.

17. The stacked circuit board structure of claim 1, wherein the plurality of receptacles is a plurality of sockets including a first group of sockets with a first maximum wall width, and a second group of sockets with a second maximum wall width that is greater than the first maximum wall width.

18. A stacked circuit board structure comprising:
a first circuit board having a first side and a second side opposite the first side;
a second circuit board having a first side and a second side opposite the first side, wherein the first side of the second circuit board faces the second side of the first circuit board;
an interposer between the first circuit board and the second circuit board, the interposer having a maximum thickness of 200 μm and including an array of vertical wires;
wherein the second side of the first circuit board is bonded to a first side of the interposer, the second side of the first circuit board including a first landing pad bonded to a plurality of vertical wires of the array of vertical wires; and
wherein the first side of the second circuit board is bonded to a second side of the interposer, the first side of the second circuit board including a second landing pad bonded to the plurality of vertical wires of the array of vertical wires.

19. The stacked circuit board structure of claim 18, wherein the array of vertical wires embedded in a thermoset polymer layer that adheres to the first landing pad and the second landing pad.

20. A stacked circuit board structure comprising:
a first circuit board having a first side and a second side opposite the first side;
a second circuit board having a first side and a second side opposite the first side, wherein the first side of the second circuit board faces the second side of the first circuit board;
a plurality of magnets mounted separately mounted onto the second side of the first circuit board; and
a plurality of pins mounted onto the first side of the second circuit board;
wherein the plurality of pins rests on the plurality of magnets and each pin is attracted to a magnetic field of a corresponding magnet.

\* \* \* \* \*